(12) United States Patent
Frey et al.

(10) Patent No.: US 6,430,720 B1
(45) Date of Patent: Aug. 6, 2002

(54) FUNCTIONAL TESTING METHOD AND CIRCUIT INCLUDING MEANS FOR IMPLEMENTING SAID METHOD

(75) Inventors: Christophe Frey, Meylan; Stéphane Hanriat, Saint Vincent de Mercuze, both of (FR)

(73) Assignee: SGS-Thomson Microelectronics S.A., Gentilly (FR)

(*) Notice: Subject to any disclaimer, the term of this patent is extended or adjusted under 35 U.S.C. 154(b) by 0 days.

(21) Appl. No.: 09/103,189

(22) Filed: Jun. 23, 1998

(30) Foreign Application Priority Data

Jun. 24, 1997  (FR) .............................................. 97 08166

(51) Int. Cl.[7] ........................ G01R 31/28; G06F 11/00; G06K 5/04; G11B 5/00; G11B 20/20
(52) U.S. Cl. ........................ 714/744; 714/700; 714/731
(58) Field of Search ........................... 714/5, 726, 727, 714/728, 729, 731, 700, 738, 739, 744

(56) References Cited

U.S. PATENT DOCUMENTS

| 4,553,090 A | * | 11/1985 | Hatano et al. ............ 324/73 AT |
| 5,141,306 A | * | 8/1992 | Gasoi ........................ 352/244 |
| 5,146,159 A | * | 9/1992 | Lau et al. ................... 324/537 |
| RE34,445 E | * | 11/1993 | Hayes et al. ................ 714/718 |
| 5,321,399 A | * | 6/1994 | Notani et al. ............... 341/100 |
| 5,341,096 A |   | 8/1994 | Yamamura ................. 324/765 |
| 5,349,587 A |   | 9/1994 | Nadeau-Dostie et al. .. 371/22.3 |
| 5,381,420 A |   | 1/1995 | Henry ....................... 371/22.3 |
| 5,485,473 A | * | 1/1996 | Diebold et al. ............. 714/724 |
| 5,614,838 A |   | 3/1997 | Jaber et al. ................. 324/765 |

FOREIGN PATENT DOCUMENTS

JP   09096664 A   *   4/1997   ........... G01R/31/31

OTHER PUBLICATIONS

French Search Report from French application No. 9708166, filed Jun. 24, 1997.

* cited by examiner

Primary Examiner—Albert Decady
Assistant Examiner—Joseph D. Torres
(74) Attorney, Agent, or Firm—Wolf, Greenfield & Sacks, P.C.; James H. Morris; Robert A. Skrivanek, Jr.

(57) ABSTRACT

The present invention relates to a method of functional testing of a logic circuit and to an integrated circuit for implementing the method. The method includes providing at least one test pattern and the storage of this test pattern in a first test register, this providing step being synchronized by an external clock signal; serially providing of this test pattern to an input of the internal logic circuit, this providing step being synchronized by a test clock signal generated from an internal clock signal; storing, in a second test register connected to the output of the internal logic circuit, at least one resulting pattern generated by the internal logic circuit when the test pattern is provided thereto, this storing being synchronized by the test clock signal; and providing to the outside, by series shifting, of the resulting pattern, this providing step being synchronized by the external clock signal.

10 Claims, 4 Drawing Sheets

FIG. 7a   CKFAST
FIG. 7b   CKEN
FIG. 7c   BURSTOK
FIG. 7d   CK5
FIG. 7e   P0
FIG. 7f   P1

FIG. 8

FIG. 9a DATA
FIG. 9b CLOCK

FUNCTIONAL TESTING METHOD AND CIRCUIT INCLUDING MEANS FOR IMPLEMENTING SAID METHOD

BACKGROUND OF THE INVENTION

1. Field of the Invention

The present invention relates to the field of the functional testing of logic integrated circuits or integrated circuits including logic portions.

2. Discussion of the Related Art

The production of an integrated circuit generally includes steps of testing of the manufactured circuits. The manufacturing can itself be, possibly, aimed at a testing, when a new circuit has to be validated or the manufacturing of a circuit has to be transferred from a known technology to a new technology.

These tests are usually of two types: structural tests, on the one hand, and functional tests, on the other hand. Structural tests have the object of checking that the circuits have no physical defects which make them inoperative, these defects being independent from the applications of the circuits. Functional tests have the object of checking, for circuits exhibiting no physical defects, that these circuits operate properly for the applications for which they are meant.

These tests, generally driven by automated test machines, can be performed before encapsulation, by means of probes enabling to have access to the circuit access pads. They can also be performed after encapsulation, by having access to the circuit through its access leads.

A method to implement the functional tests is to send logic signals on the inputs (pads or leads) of the circuit to be tested, observing the states of the signals provided on its outputs (pads or leads) and comparing these states with the states theoretically expected. The states of the provided logic signals form what is usually called test patterns or vectors.

Since it is desired to continually decrease the surface of circuits while increasing the circuit integration and operating frequency, this method has several disadvantages.

First, in practice, the number of circuit inputs and outputs does not increase proportionally to the increasing complexity of the circuits. The decrease in the minimum manufacturing resolutions allows more and more complex circuits, for an equal surface, while the number of pads increases little. Indeed, this number of pads is a function of the type of package in which the circuit is to be inserted. Now, the size of the leads has to be large enough to enable a reliable welding of its leads and, proportionally, this size decreases slower than the minimum manufacturing resolutions. Since, moreover, it is generally desired to limit the surface area occupied by the circuits, this results in an increase in the number of internal circuits which are not directly accessible from the outside of the circuits. A problem of access to internal circuit elements thus arises during the tests. This is even more of a problem for circuits including, for example, internal processors using peripherals without any relation to the outside, such as program memories or dynamic memories. Internal compound testing devices made by means of shift registers disposed on the internal buses of the circuits and driven by external testing appliances may be implemented. Thereby, a better observability of the internal devices of the circuits is obtained. Indeed, a higher number of test signals can be provided, for an equal number of inputs and outputs, by using series inputs and outputs to provide the test vectors one by one and receive the states of the signals resulting from their taking into account by the circuit (these resulting states will be called resulting vectors hereafter). Conversely, this is done at the cost of the test duration since it is necessary, for each test step, to provide in series a test vector, and to receive the resulting vector. Further, a test can only be implemented step by step, which is little representative of the final operation of the tested circuit.

Another problem arises from the desire to have higher and higher performance circuits in terms of operating frequency. Indeed, for their results to be representative, the tests must be performed in normal operating conditions. This amounts, in practice, to using wide pass-band testing devices, able to provide and sample signals at the operating frequencies of these circuits, these frequencies being likely to reach several hundreds of megahertz. This sets problems of implementation of the testing devices, for example, as concerns the probes needed to access to the circuit pads or leads.

Another problem arises from the possible presence of internal circuits operating at a higher operating frequency than the internal interface circuits. Internal interface circuits are generally sized with respect to the loads that they have to withstand on the input and output pads or leads. There is a tendency to use buffer circuits, capable of providing high currents, but the performances of which are limited in terms of operating frequency, to avoid a very high power consumption. Conversely, to implement the internal logic circuits, higher frequencies may be used, the loads withstood by these circuits being generally low. If such is the case, these logic circuits will be difficult to test since, even if access can be had to these circuits via the pads or leads, the frequency will be limited by the interface circuits.

A solution to these problems is to use automated testing devices disposed in the circuits to perform functional tests, and controlled by programs disposed in the circuits.

A first problem caused by this type of solution is the surface area occupied by these internal testing resources. This surface area is occupied at the cost of the surface area occupied by the circuits actually used in the applications, which limits the useful functional surface of the circuits, and this, all the more as the tests are more complex.

The surface of these devices may be, possibly, limited by using, during tests, resources subsequently used in the applications. For example, for circuits including an internal processor, an additional memory including a test program implemented by this processor can simply be provided. A problem then is to ensure satisfactory test coverage, especially for the internal resources used to implement the test program. In the implementation of the tests, this can also cause problems in terms of control, such as the impossibility of being able to act on the tested circuit if a blocking occurs within the tested circuit.

On the other hand, such integrated devices do not offer a flexibility similar to that offered by external devices, in the implementation of the tests. For example, modifying a test program can force modification of the circuit, unless a memory accessible from the outside is available, which is not justified if this memory is used for the testing only.

SUMMARY OF THE INVENTION

An aim of the present invention is to provide an improved method of testing of integrated circuits, which overcomes the pass-band problem linked to testing devices and to internal interface circuits.

Another object of the present invention is to provide a testing method which provides a good observability of the internal operation of the tested circuits.

Another aim of the present invention is to provide a method which does not require any internal device using a significant surface area of the circuit to be tested.

Another aim of the present invention is to provide a method which offers extended possibilities in terms of testing.

Thus, the present invention provides a method of functional testing of an integrated circuit including at least one internal logic circuit to be tested, this internal logic circuit including at least one input and one output. The method includes:

providing at least one test pattern, formed of a set of logic states, on a first input of the integrated circuit, by series shifting, and storing this test pattern in a first test register, the providing step being synchronized by an external clock signal received on a second input of the integrated circuit, serially providing this test pattern to the input of the internal logic circuit, this providing step being synchronized by a test clock signal generated from an internal clock signal generated in the integrated circuit, the first internal clock signal having a frequency higher than the frequency of the external clock signal, storing, in a second test register connected to the output of the internal logic circuit, of at least one resulting pattern generated by the internal logic circuit when the test pattern is provided thereto, this storage being synchronized by the test clock signal, and providing, by series shifting, on a first output of the integrated circuit, of the resulting pattern, this providing step being synchronized by the external clock signal.

According to an embodiment of the present invention, the internal clock signal is generated by a programmable ring oscillator.

According to an embodiment of the present invention, providing the test pattern to the internal logic circuit is performed by means of a parallel-to-series conversion circuit, so that this test pattern can be provided several times to the internal logic circuit, once this pattern has been stored in the first test register.

According to an embodiment of the present invention, the test clock signal is generated by time filtering of the internal clock signal, so that the operation of the internal logic circuit is limited in time to the duration necessary for this circuit to receive the test pattern and to generate the resulting pattern.

According to an embodiment of the present invention, the parallel-to-series conversion signal is driven by control signals, the generation of which is synchronized with the generation of the test clock signal, these control and test clock signals being provided to the parallel-to-series conversion circuit and to the internal logic circuit by means of programmable skew circuits, so that a time skew can be introduced between the control signals and the test clock signal.

The present invention also relates to an integrated circuit including an internal logic circuit and testing means for testing the operation of the internal logic circuit, this internal logic circuit including one input and one output.

The testing means include:
a first test register having an input connected to a first input of the integrated circuit and at least one output connected to the input of the internal logic circuit,
a second test register having an input connected to the output of the internal logic circuit and an output connected to a first output of the integrated circuit, a second output for receiving an external clock signal to drive, on the one hand, the provision to the first test register of at least one test pattern received on the first input, this test pattern being formed of a set of logic states, and, on the other hand, the provision to the first output of at least one resulting pattern stored in the second test register, this resulting pattern being generated on the output of the internal logic circuit when the test pattern is provided to the input of the internal logic circuit, a clock signal generation circuit for generating an internal clock signal, and a control circuit for providing, based on the internal clock signal, a test clock signal that drives the provision of the test pattern to the input of the internal logic circuit and the provision of the resulting pattern to the input of the second test register.

According to an embodiment of the present invention, the circuit includes a second output and the testing means include a frequency dividing circuit receiving the internal clock signal and generating a derived internal clock signal, of lower frequency than the internal clock signal, this lower frequency being representative of the frequency of the internal clock signal, and the derived internal clock signal being provided to the second output of the integrated circuit.

According to an embodiment of the present invention, the clock signal generating circuit includes a first programmable delay circuit for generating a programmable delay and logic circuits that implement a ring oscillator programmable by looping back of an input and of an output of the first delay circuit.

According to an embodiment of the present invention, the first delay circuit of the clock signal generating circuit generates a square signal of programmable frequency and the clock signal generating circuit includes a second programmable delay circuit receiving the square signal and providing a delayed square signal, a logic gate generating an intermediary clock signal from a combination of the square signal and of the delayed square signal, so that the intermediary signal has a programmable duty ratio, and means for generating the internal clock signal from the intermediary clock signal.

According to an embodiment of the present invention, the circuit includes a parallel-to-series conversion circuit placed between the first test register and the input of the internal logic circuit and the control circuit generates one or several selection signals to drive the parallel-to-series conversion circuit, the selection signals being generated based on the internal clock signal.

According to an embodiment of the present invention, the control circuit includes, on the one hand, a circuit of generation of drive signals for generating a filtered clock signal and primary selection signals and, on the other hand, skew circuits receiving the filtered clock signal and the primary selection signals, these skew circuits including programmable delay circuits for generating, based on the received signals, the selection signals driving the parallel-to-series conversion circuit and the test clock signal, the selection signals driving the parallel-to-series conversion circuit being skewed with respect to the test clock signal.

According to an embodiment of the present invention, the control circuit includes filtering means for generating, based on the internal clock signal, in a so-called burst test mode, the test clock signal driving the operation of the internal logic circuit, this test clock signal including at least one pulse train including a determined number of pulses.

According to an embodiment of the present invention, the control circuit provides a logic signal representative of the duration of pulse trains in the burst test mode.

In the present invention, an external testing device is used to implement the test, which overcomes the problems linked to the use of tests by internal testing devices. To overcome the problem of the testing devices and interface circuit pass-band, the data exchanges between the testing device and the circuit to be tested are performed at a frequency compatible with normal operating frequencies of the testing device and of the interface circuits of the circuit to be tested. The test itself is performed in conditions compatible, in terms of frequency and of progress, with the normal operating conditions of the tested circuit, which obtains test results representative of this normal operation.

The foregoing objects, features and advantages of the present invention will be discussed in detail in the following non-limiting description of an example embodiment in connection with the accompanying drawings.

DETAILED DESCRIPTION

Figure 1:
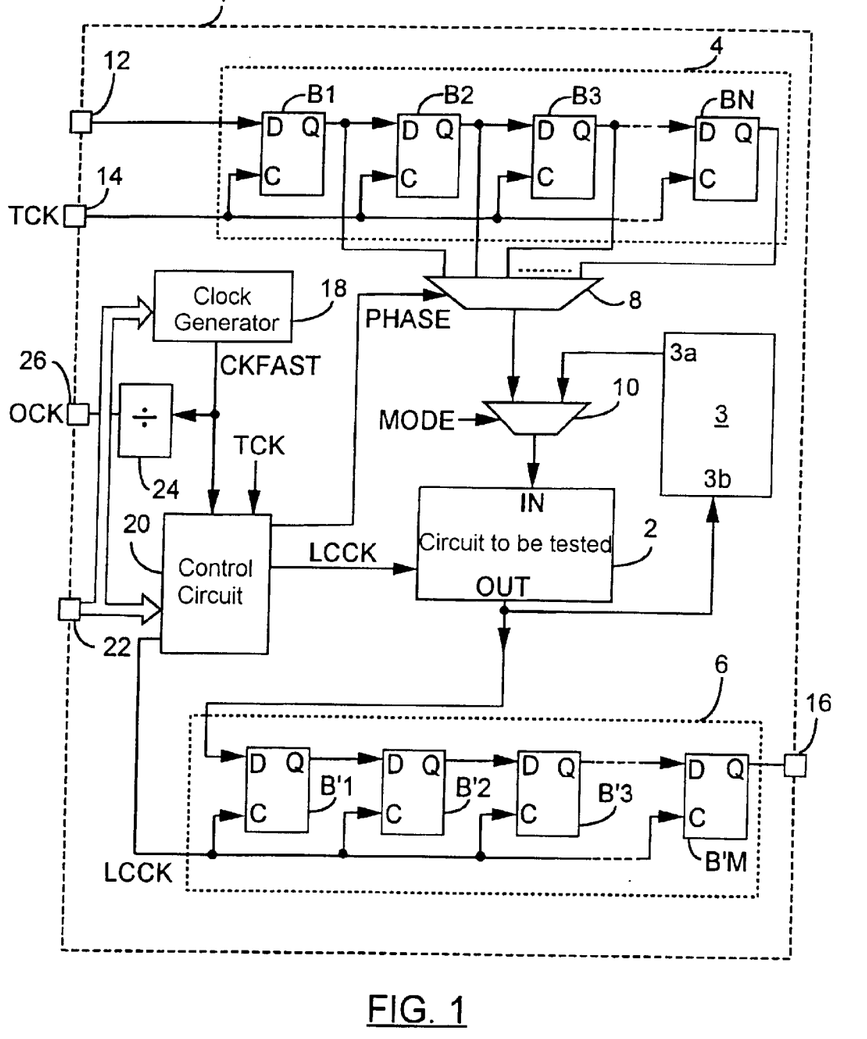
FIG. 1 illustrates an example of circuit implementing the present invention.

FIG. 1 illustrates a simplified example of integrated circuit 1 implementing the functional test method according to the present invention.

This integrated circuit 1 includes an internal logic circuit 2 to be tested including, in the example, an input IN and an output OUT. The number of inputs and outputs of circuit 2 can of course be higher. Further, circuit 1 can include other internal logic circuits.

Circuit 1 can be a test circuit, that is, implemented for the purpose of design and/or technology validation. It could also be a circuit meant for commercial purposes, which includes circuits operating at a fast internal clock frequency. In this case, circuit 2 can be connected to one or several other circuits internal to circuit 1. Thus, in FIG. 1, a circuit 3 including an output 3a and an input 3b, so that it can exchange logic states with circuit 2, has been shown. Circuit 2 can be, for example, a cache memory having a faster operating frequency than the operating frequency of other elements of circuit 1.

The test method includes providing, from an external testing device (not shown) to circuit 1, of one or several test patterns and providing, from circuit 1 to the testing device, of one or several patterns resulting from the application of the test vectors.

"Test pattern" refers to a set of logic states which are applied to primary inputs of circuit 1. "Resulting pattern" refers to a set of logic states generated internally in circuit 1 and provided by primary outputs as a response to the test pattern(s). For a given circuit, the logic states forming the resulting patterns are compared with expected logic states, these expected logic states being calculated based on the logic equations of the circuit and based on all states provided to the circuit by the testing device. There is success if the states provided by the circuit coincide with the expected states.

The patterns are formed of vectors or of portions of vectors. "Vector" designates a logic signal (if the vector is of dimension 1) or several simultaneously provided or received logic signals (if the vector is of greater dimension). In the example described hereafter, test vectors and resulting vectors of dimension 1 will be considered, this dimension corresponding to the number of inputs and outputs of internal logic circuit 2. If P vectors of dimension K greater than 1 are used, K patterns of dimension P will be used, each pattern storing one of the K states of the vectors. "Primary inputs/outputs of a circuit" designates the circuit nodes accessible from outside the circuit, that is, directly connected to access pads. The state of these nodes can be controlled (that is, imposed and/or observed) directly by a test machine, either at the level of pads, before encapsulation, or at the level of leads connected to these pads, after encapsulation.

The functional testing method includes the following steps:

serially providing, on a primary input of circuit 1, at least one test pattern formed of N test vectors, of dimension 1, to be applied to input IN of internal logic circuit 2, and the storage of these values in a first test register 4, this providing step being synchronized by an external clock signal TCK of frequency lower than or equal to the maximum operating frequencies of the testing device and the inputs/outputs of circuit 1, the internal clock signal being received on a primary input 14 of circuit 1, serially providing these test vectors to input IN of internal logic circuit 2, at a frequency which can be higher than or equal to the normal operating frequency of this internal logic circuit, this providing step being synchronized by a test clock signal LCCK generated from an internal clock signal CKFAST, storing, in a second test register 6, connected to output OUT of the internal logic circuit, a resulting pattern formed of M resulting vectors, of dimension 1, appearing on this output OUT when the N test vectors are provided to the logic circuit, this storing step being synchronized by the test clock signal, and serially providing, on a primary input of the integrated circuit, the resulting pattern, this providing step being synchronized by the external clock signal, that is, at a frequency lower than or equal to the maximum operating frequencies of the testing device and of the primary inputs/outputs of circuit 1.

Each test vector is formed of one logic state, that is, of the number of logic states to be simultaneously provided to circuit 2 for its operation. Each resulting vector is formed of one logic state, that is, of the number of logic states simultaneously generated by circuit 2 in operation.

If the internal logic circuit includes several functionally connected inputs, test vectors having a dimension corresponding to the number of inputs are used. Thus, if circuits 2 has two functionally connected inputs, two registers will be used to store test vectors each including two states. One of the registers will store a first test pattern formed by all first states of the vectors and the other register will store a second test pattern form by all second states of the vectors. In test mode, the two states of each vector will be provided simultaneously to the two inputs of circuit 2.

Similarly, if the circuit includes several functionally connected outputs, the dimension of the resulting vectors will correspond to the number of outputs. A bank of registers will then be used to store the resulting vectors. The number of registers and of resulting vectors that they can store will of course correspond to the dimension of the received resulting vectors.

The first and second test registers 4 and 6 are formed, respectively, of N flip-flops B1, B2, . . . , BN connected in series, and of M flip-flops B'1, B'2, . . . , B'M connected in series. These flip-flops include a data input D, a data output Q, and a clock input C.

Circuit 1 includes a parallel-to-series conversion circuit disposed between the first test register 4 and the internal logic circuit 2 to be tested. This circuit is, in the example, a multiplexer 8 including N inputs, connected to the outputs of the flip-flops of register 4, and one output. It provides to input IN of circuit 2, successively, N states of the N test vectors (since the vectors are of dimension 1, each vector will be confounded with the logic state forming it). The use of a parallel-to-series conversion circuit maintains the states (or vectors of dimension 1) in register 4 when these states are issued to circuit 2. Thereby, it is possible to provide the same states or test vectors several times to circuit 2 without having to load register 4 several times. If circuit 2 is a memory, reliability tests could, for example, be performed by writing or reading several times in a row a same datum at a same address. The states provided to circuit 2 can even be modified simply by modifying the control signals of the multiplexer, which amounts to permuting the states in register 4. Considering the use of several input test registers, the contents of part of the registers can also be modified without having to modify the content of all registers. It will then of course be seen to it that all these registers are not chained when data are provided thereto, to be able to selectively have access to these registers.

According to the nature of the tests envisaged, the use of a parallel-to-series conversion circuit could possibly be avoided. It is then enough to provide in series the states forming the test pattern, via output Q of the last flip-flop BN of test register 4. This limits the surface occupied by the test circuit and, more specifically, by multiplexer 8 and the conductive lines connecting its inputs to the flip-flop outputs.

In the example, the output of multiplexer 8 is connected to an input of a multiplexer 10 including two inputs and one output connected to input IN of circuit 2. The other input of multiplexer 10 is connected to output 3*a* of circuit 3 and it receives a control signal MODE. Such a configuration typically provides the test pattern stored in register 4 to input IN when in test mode, and to connect input IN to output 3*a* when in normal operation. Typically, signal MODE is a binary signal, the state of which is representative of the ongoing mode. It can be provided, for example, by the external test machine, via a primary input/output of circuit 1.

Output OUT is connected to input D of the first flip-flop B'1 of output register 6. In the example shown, output OUT is also connected to input 3*b* of circuit 3. Of course, an output OUT dedicated to the testing may be used, in which case this input will be connected to flip-flop B'1 only. What matters is that the logic states provided on this output OUT are representative of the internal operation of circuit 2.

Test register 6 and output OUT of circuit 2 can possibly be connected via a demultiplexer having one input and M outputs, in a way similar to the connection made between test register 4 and input IN. Although this results in a greater bulk of the test resources, it enables, for example, use of flip-flops having a lower operating frequency than logic circuit 2, without this preventing storage of the output states in register 6. It should be noted that this advantage is of course shared by the flip-flops of register 4 which are connected to circuit 2 via multiplexer 8. Since multiplexers and demultiplexers are conventionally implemented by means of logic gates or CMOS switches, these elements will of course be chosen to have a response time which is compatible with the operating frequency of logic circuit 2.

Circuit 1 includes a primary input 12 providing logic states to register 4, by series shifting from the outside. This input 12 is connected to input D of the first flip-flop B1 of register 4.

Circuit 1 also includes a primary input 14 providing external clock signal TCK, generated outside of circuit 1, to inputs C of the flip-flops of register 4. Signal TCK has a frequency compatible with the pass-band of input 14 and, accordingly, compatible with the external device which provides it to circuit 1. It synchronizes the shifting of logic states in the flip-flops of register 4.

Circuit 1 also includes a primary output 16, connected to output Q of the last flip-flop B'M of register 6. It transferring, by series shifting, the content of this register to the outside of circuit 1. The state shifting in the flip-flops of register 6 is driven by a test clock signal LCCK. As will be seen hereafter, test clock signal LCCK will be an internal clock signal either of frequency equal to the operating frequency of circuit 2, or of frequency equal to that of signal TCK. The fast frequency will be used to load in series, in flip-flops B'1 to B'M, the resulting patterns appearing on output OUT. The slower frequency, that is, the frequency of external clock signal TCK, will be used to provide the resulting patterns to the outside of integrated circuit 1.

To store a test pattern of N logic states (these N logic states being N test vectors of dimension 1 or N states of N test vectors of higher dimension) in register 4, this pattern is provided in series on input 12, external clock signal TCK being active. By shifting in flip-flops B1, B2, . . . , BN, N logic states of the test pattern are disposed in these flip-flops after a duration corresponding to N periods of signal TCK.

The transfer to the outside a resulting pattern of M logic states from register 6 is performed by shifting in flip-flops B'1, B'2, . . . B'M, external clock signal TCK being active and provided to the flip-flops of register 6 (then, LCCK= TCK). After a duration corresponding to M periods of signal TCK, these M logic states have been issued to output 16.

To implement the method according to the present invention, circuit 1 includes a clock signal generation circuit 18 and a control circuit 20. It will be assumed that circuits 18 and 20 are programmable and accessible from the outside, via an input port 22 of circuit 1.

Circuit 18 provides an internal clock signal CKFAST. It is assumed that this internal signal CKFAST has a frequency which can be higher than the maximum operating frequency of the primary inputs/outputs of circuit 1. To make this signal observable outside of circuit 1, circuit 1 includes a frequency divider 24 including an input receiving signal CKFAST and an output connected to a primary output 26 of circuit 1 and enabling to issue a derived clock signal OCK, of frequency representative of the frequency of signal CKFAST. The constitution of circuit 24 will not be described in detail, this type of circuit being well known in the field of integrated circuits. Of course, the division factor of the frequency of signal CKFAST will be chosen so that the frequency of derived signal OCK is compatible with the maximum operating frequency of the primary inputs/outputs of circuit 1 and by the test machine used to test circuit 2.

Internal clock signal CKFAST is provided to control circuit 20 which drives the implementation of the tests of circuit 2. In practice, this control circuit will control multiplexer 8, internal circuit 2 and the loading of register 6, by providing thereto clock and control signals. Thus, a selection signal PHASE, provided to multiplexer 8, and clock signal LCCK, issued to inputs C of the flip-flops of test register 6 and to logic circuit 2, have been shown.

Typically, signal PHASE is a selection signal that links, respectively, the inputs of multiplexer 8 to its output. Of course, if N is higher than 2, selection signal PHASE will in fact be formed of a set of several selection signals. Thus, in the following illustrated example, it will be assumed that register 4 includes four flip-flops and that the multiplexer receives two selection signals PHASE0 and PHASE1.

Test clock signal LCCK is used, during tests, to synchronize the operation of internal logic circuit 2. This signal can also be provided to circuit 2 during the normal operation of circuit 1. It can also be dedicated to the functional testing of circuit 2 and be replaced, in normal operation, by another clock signal (issued to circuit 2, for example, by a multiplexer receiving both clock signals and controlled by signal MODE).

A detailed example of implementation of the elements forming the test resources, and especially of circuits 18 and 20, will now be given.

It will be assumed that N=M=4. In practice, one can have M>N if the provision of N states on input IN induces the generation of a higher number of states on output OUT.

In a first, so-called burst test mode, one or several trains of N+1 pulses will be generated in test clock signal LCCK. During the N first pulses, the states present at the output of flip-flops B1 to BN are provided to circuit 2. An additional pulse is provided to take into account the effect, on output OUT, of the provision of the N-th state on input IN. According to the type of tested circuit, a train of more than N+1 pulses could be used, according to the delay induced by the tested circuit between the time when its input(s) receive(s) given states and the time when these states induce a modification of the states on the output(s) of the tested circuit. In other words, the operation of the internal logic circuit is limited in time to the duration required for it to receive a test vector and to accordingly issue a resulting vector.

In a second, so-called continuous test mode, a continuously oscillating test clock signal LCCK will be generated so that, for example, power consumption and aging tests may be performed.

1— Means of Implementation of the Test

Figure 2:
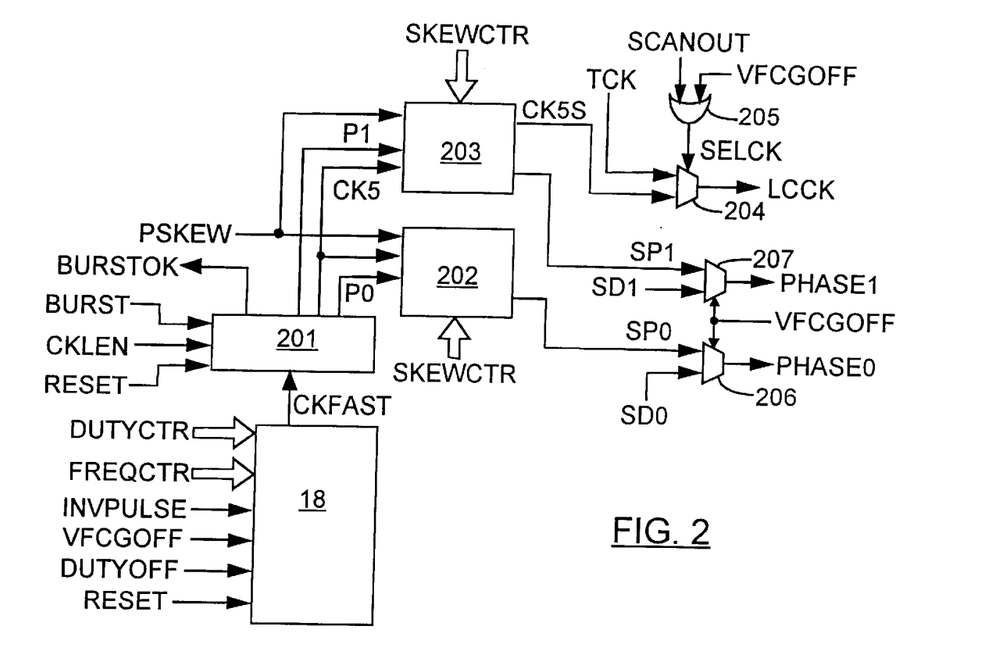
FIG. 2 illustrates a more detailed example of elements of control of the circuit of FIG. 1.

FIG. 2 illustrates a block diagram of the assembly formed by clock signal generation signal 18 and control circuit 20.

As has been mentioned, circuit 18 generates an internal clock signal CKFAST, which will be used to generate test clock signal LCCK issued to logic circuit 2 and to test register 6.

Circuit 18 receives control signals from port 22 (not shown).

In the example shown, circuit 18 receives:
a first control signal RESET which controls the resetting of the test circuits,
a second logic control signal VFCGOFF which controls the starting or the stopping of the generation of internal clock signal CKFAST,
a third logic control signal INVPULSE which determines the polarity of internal clock signal CKFAST,
a fourth control signal DUTYOFF which controls a mode of programming of the duty ratio of internal clock signal CKFAST,
a first set of control signals FREQCTR which control the frequency of internal clock signal CKFAST,
a second set of control signals DUTYCTR which control the duty ratio of internal clock signal CKFAST when signal DUTYOFF is in a given state, for example when DUTYOFF=0.

Control circuit 20 includes an assembly of circuits 201, 202, 203, 204, 205, 206, and 207.

It receives control signals from the outside, via port 22 (not shown) and issues drive signals of the test means and a signal representative of the duration of pulse trains in the burst test mode.

Internal clock signal CKFAST is provided to a drive signal generation circuit 201 which generates, from this signal, a filtered clock signal CK5 and primary selection signals P0 and P1.

In burst test mode, filtered clock signal CK5 is implemented based on a time windowing of internal clock signal CKFAST. It reproduces the state switchings of signal CKFAST during a limited time period. Otherwise, it is in a constant state. In practice, a windowing such that a pulse train in filtered signal CK5 includes a determined number of N+1=5 pulses will be produced. Signal CK5 will be used to generate test clock signal LCCK applied to circuit 2 and to register 6, during the testing.

Primary selection signals P0 and P1, synchronous with filtered clock signal CK5 are used, as will be seen hereafter, to control multiplexer 8, that is, to drive, in test mode, the provision of logic signals to input IN of internal logic circuit 2.

Circuit 201 receives control signals from port 22.
In the example, circuit 201 thus receives:
signal RESET,
control signal CKLEN that controls the pulse generation in signal CK5, these pulses being limited in time, in burst test mode, and
a control signal BURST that controls the test mode, in burst mode (it will then be assumed that BURST=1) or in continuous mode (it will then be assumed that BURST=0).

Finally, circuit 201 provides a logic signal BURSTOK representative of the duration of pulse trains in the burst test mode. Signal BURSTOK will be generated, in the example, so that it is in a high logic state when signal CK5 is formed of pulses and in a low logic state otherwise. Thus, in burst test mode, logic signal BURSTOK changes states during a period corresponding to N+1 pulses in signal CK5. It thus has a lower frequency than the internal clock signal, which provides it on an output of circuit 1. Of course, it is here assumed that the frequency of signal BURSTOK is compatible with the maximum operating frequencies of the inputs/outputs of circuit 1 and of the testing device. If a period of N+1 pulses is too low, a longer state switching of signal BURSTOK may be generated. By sampling signal BURSTOK, the number of pulses in signal CK5 can be determined, knowing that derived clock signal OCK further allows determination of the frequency of this signal.

Signals CK5 and P0 are provided to a skew circuit 202 which further receives a logic control signal PSKEW and a set of control signals SKEWCTR. Signals SKEWCTR are used to program the value of a skew between signals P0 and CK5. Signal PSKEW controls the direction, be it an advance or a delay, of this skew. Skew circuit 202 generates a selection signal SP0 reproducing signal P0, with a skew which depends on the states of signals SKEWCTR and PSKEW.

Signals CK5 and P1 are provided to a skew circuit 203 which further receives logic signal PSKEW and the set of signals SKEWCTR. Signals SKEWCTR are used to program the value of a skew of signals P1 and CK5. Signal PSKEW controls the direction, be it an advance or a delay, of this skew. Skew circuit 203 generates a selection signal SP1 reproducing signal P1, with a skew which depends on the states of signals SKEWCTR and PSKEW. It also generates a clock signal CK5S, reproducing signal CK5, with a skew which depends on the states of signals SKEWCTR and PSKEW.

Test clock signal LCCK is generated by selecting internal clock signal CK5S or external clock signal TCK. This selection is performed, in the example, by means of a two-input multiplexer 204 receiving said signals on its inputs. It is provided that LCCK=TCK when the generation of internal clock signal CKFAST is stopped or when it is desired to shift logic states from circuit 1 to the outside.

Thus, in the example, multiplexer 204 is controlled by a logic selection control signal SELCK. Signal SELCK is generated by an OR-type two-input logic gate 205. Gate 205 receives signal VFCGOFF on a first input and a logic control signal SCANOUT on the other input. Signal SCANOUT, received, for example, on port 22, enables to control the selection of external clock signal TCK to drive the flip-flops of register 6 during the shifting of the content of this register to the outside.

In the illustrated example, two logic selection signals PHASE0 and PHASE1 are generated to control multiplexer 8. The two signals form four logic states, which correspond to the number N of inputs of multiplexer 8. Signals PHASE0 and PHASE1 are generated by selection circuits 206 and 207 which enable either to have PHASE0=SP0 and PHASE1=SP1, or to have PHASE0=SD0 and PHASE1=SD1, with SD0 and SD1 being signals issued to circuit 1 from the outside. In the example illustrated, selection circuits 206 and 207 are two multiplexers controlled by logic signal VFCGOFF. It is thus possible to directly control multiplexer 8 from the outside, which can be useful in case of a failure of circuits 18 and/or 20 or of a blocking during a test. It then remains possible to control registers 4 and 6 from the outside and to operate circuit 2 (external clock signal TCK is then used).

Examples of implementation of the elements of FIG. 2 and their operation will now be described in more detail.

To generate internal clock signal CKFAST, a ring oscillator is, for example, used. This oscillator will preferably be programmable, so that an internal clock signal of variable frequency can be generated, which allows testing of circuit 2 at variable frequencies. The maximum operating frequency of circuit 2 can thus be determined, as well as the type of operations which limit the value of this frequency.

2—Ring Oscillator

Figure 3:
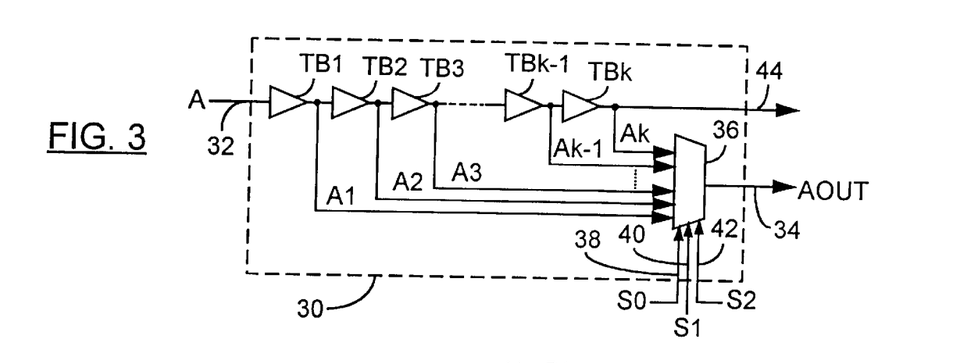
FIG. 3 illustrates a delay circuit implementing a programmable ring oscillator.

FIG. 3 illustrates an example of delay circuit 30 implementing a programmable ring oscillator. It includes an input 32 for receiving a logic input signal A and an output 34 for providing a logic output signal AOUT. Signal A is provided to an assembly of k buffer circuits TB1, TB2, . . . TBk connected in series.

Each buffer circuit has an input and an output. Its input is connected to input 32, for circuit TB1, or to the output of the circuit before it. These buffer circuits will, for example, be formed of two inverters connected in series. Thereby, each buffer circuit reproduces on its output the signal that it receives on its input, with a delay depending on the sizing of its inverters. The signals, noted A1, A2, . . . Ak, present on the outputs of circuits TB1, TB2, . . . TBk, are provided to k inputs of a multiplexer 36 having k inputs. Multiplexer 36 has an output which provides signal AOUT, the selection of the input providing signal AOUT being performed according to the states of logic selection signals issued to multiplexer 36. In the example, it has been assumed that circuit 30 receives three selection signals S0, S1, and S2 on inputs 38, 40, and 42. A multiplexer having at least eight inputs can thus be controlled.

To form a ring oscillator, it is enough to connect input 32 and output 34 via an odd number of inverting gates, so that the number of inverter circuits connected in series is odd. An oscillating signal of frequency inversely proportional to the number of inverters forming the ring oscillator will then be generated. Of course, it will be possible not to provide all signals generated by the buffer circuits to the output multiplexer. This limits the size of the circuit and of the means issuing the selection signals, at the cost of the number of different frequencies which can be output.

Figure 4:
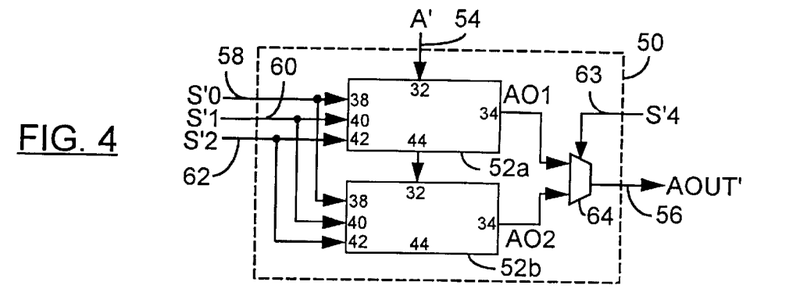
FIG. 4 illustrates a delay circuit formed of two circuits similar to that in FIG. 3.

Circuit 30 includes an output 44 for providing signal Ak. This allows making several ring oscillators of different lengths to selectively provide clock signals of different frequencies. FIG. 4 thus shows a delay circuit 50 formed of two delay circuits 52a and 52b which will be assumed to be identical to delay circuit 30.

Delay circuit 50 includes an input 54 receives a logic signal A'. This input 54 is connected to input 32 of circuit 52a. Input 32 of circuit 52b is connected to output 44 of circuit 52a. Circuits 52a and 52b respectively provide, on their output 34, logic signals AO1 and AO2. Their control inputs 38, 40, and 42 are connected to control inputs 58, 60, and 62 so that they receive logic control signals S', S'1, and S'2. Finally, circuit 50 includes an output 56 providing an output signal AOUT' and an input 63 receiving a logic selection signal S'4. Output signal AOUT' is provided by a multiplexer 64 which receives signals AO1 and AO2 on two inputs and signal S'4 on one control input so that AOUT'=AO1 and AOUT'=AO2.

As previously, to generate an oscillating signal, it is enough to connect input 54 and output 56, via an odd number of inverting gates. Circuit 52a will provide a first oscillating signal AO1 and circuit 52b will provide a second oscillating signal AO2, of lower frequency.

A greater number of circuits in parallel can of course be used. Different control signals may be issued, if desired, to the circuits connected in series, which allows greater flexibility, at the cost of the surface area occupied by delay circuit 50.

3—Clock Generating Circuit

Figure 5:
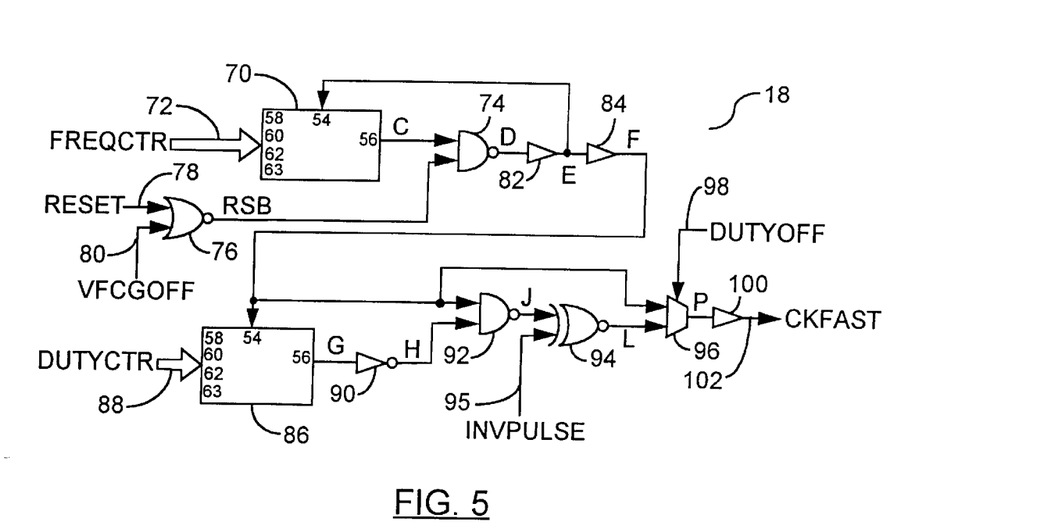
FIG. 5 illustrates a programmable clock signal generating signal generating an internal clock signal.

FIG. 5 illustrates an example of implementation of clock generating circuit 18.

Figure 6:
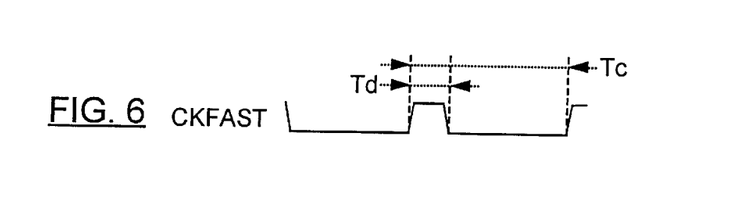
FIG. 6 shows a timing diagram of a clock signal generated by the circuit of FIG. 5, FIGS. 7a to 7f illustrate timing diagrams of signals generated and received by a drive signal generation circuit.

As has been mentioned, this circuit provides internal clock signal CKFAST via ring oscillators driven according to control signals. Signal CKFAST, illustrated in FIG. 6, is a binary logic signal which will be defined by its period Tc and by the duration Td during which it is in the high state (in other words, by its cycle time).

Circuit 18 includes a programmable delay circuit 70 which will be assumed to be similar to circuit 50 illustrated in FIG. 4.

This circuit is driven by the set of control signals FREQCTR, received on an input 72 of circuit 18. The logic signal generated on output 56 of circuit 70 is referred to as C. Logic signal C is a square signal. It is provided to a first input of a two-input logic gate 74, of NAND type. Gate 74 receives a logic enable signal RSB on its second input. Signal RSB is provided by a NOR-type two-input gate 76. The inputs of gate 76 receive logic control signals RESET and VFCGOFF, these signals being received on inputs 78 and 80 of circuit 18.

Logic gate 74 generates a logic signal D which is provided to the input of a buffer signal 82. Buffer signal 82 generates a logic signal E which is provided to input 54 of circuit 70.

When enable signal RSB is in the low state, signal D is always in the high state. Signal C then is always in the high state. To position signal RSB in the low state, it is enough to position one of signals RESET or VFCGOFF in the high state. During a test, typically, the test means will be reset by setting signal RESET to the high state, signal VFCGOFF being in the high state. Once the reset has been performed, an internal clock signal can be, at will, generated or not, by controlling the state of signal VFCGOFF. If the latter is in the low state, signal RSB will be positioned in the high state. Gate 74 will then be equivalent to an inverter receiving signal C as an input. Assuming that buffer circuit 82 is formed of two inverters connected in series, input 54 and output 56 of circuit 70 are then connected via an odd number of inverting gates. Signal C will thus oscillate, at a frequency which will depend on the states of the control signals forming set FREQCTR. Further, signal C will be a square signal, assuming that inverters having equivalent positive and negative transition delays are available.

The joint use of signals RESET and VFCGOFF reduces or eliminates risk of double propagation of signals in the ring oscillator providing signal CKFAST. Such a risk appears if the frequency of the internal clock signal is modified while it is being generated. The use of signal VFCGOFF temporarily stops the generation of signal CKFAST upon modifications of the control signals, without it being necessary to reset all the circuits dedicated to the testing.

Circuit 18, in addition generating a clock signal of programmable frequency, includes means for programming its cycle time and its polarity.

For this purpose, logic signal E is provided to a programmable delay circuit 86 which will be assumed to be similar to circuit 50 of FIG. 4. In the example, signal E is provided via a buffer circuit 84 which receives signal E as an input and generates a logic signal F. Signal F is provided to input 54 of circuit 86. The logic signal generated on output 56 of circuit 86 will be referred to as G. Signal G is a square signal, delayed with respect to signal F. Circuit 86 will indeed modify signal F according to the set of control signals DUTYCTR, received on an input 88 of circuit 18.

Circuit 18 further includes an inverter 90, a two-input NAND-type logic gate 92, a two-input X-NOR logic gate 94, a multiplexer 96 and a buffer circuit 100.

Signal G is provided to inverter 90 which generates a logic signal H, which is the inverse of signal G. Logic signals F and H are provided to the inputs of gate 92. Gate 92 generates an intermediate logic signal J. Signal J is provided to an input of gate 94. This gate further receives from an input 95 of circuit 18 logic control signal INVPULSE. The logic signal generated by gate 94 is referred to as L. Signals F and L are provided to the inputs of multiplexer 96. This multiplexer receives from an input 98 of circuit 18 logic control signal DUTYOFF. It generates a logic signal referred to as P. According to the state of signal DUTYOFF, P=F (for example, if DUTYOFF=1) or P=L (if DUTYOFF=0). Signal P is provided to buffer circuit 100, this buffer circuit generating internal clock signal CKFAST.

If DUTYOFF=1, signal CKFAST is a square clock signal, reproducing signal F.

Assume that it is desired to modify the duty ratio of signal CKFAST so that it is no longer 50%. For this purpose, signal DUTYOFF is positioned in the low state. Signal L is then used to generate internal clock signal CKFAST.

Circuit 86 will more or less delay signal F, according to the state of the set of signals DUTYCTR. Consider the rising edges of signal F. The rising edges of signal G will be delayed with respect to the rising edges of signal F. Since signal G is inverted to generate signal H, a signal H having its rising edges somehow delayed with respect to those of signal F will be obtained. Gate 92 will generate a signal J, the falling edges of which correspond to the falling edges of signal F and the rising edges of which correspond to the rising edges of signal H.

Assume that INVPULSE=0. Gate 94 then operates as an inverter receiving signal J as an input. In other words, the rising edges of signal L (and, accordingly, of signal CKFAST) correspond to the rising edges of signal F. The position of the falling edges of signal L will depend on the delay induced by circuit 86. Anyhow, since the inversion in inverter 90 is somehow equivalent to advancing signal G with respect to signal F, the falling edges of signal L (and, accordingly, of signal CKFAST) will be advanced in time with respect to the falling edges of signal F. A signal CKFAST of duty ratio lower than 50% is thus generated, with its rising edges corresponding to the rising edges of signal F.

By positioning signal INVPULSE in the high state, a signal CKFAST of duty ratio higher than 50% will be generated in a simple manner. Signal L then is equivalent to signal J, that is, has a duty ratio higher than 50% and its rising edges are delayed with respect to the rising edges of signal F.

4—Synchronization Circuit

A functional description of the example of embodiment of drive signal generating circuit 201 will be given in VHDL:

library IEEE;
use IEEE.std_logic_1164.all; use IEEE.std_logic_unsigned.all
entity 201 is
port(
   RESET: in std_ulogic; BURST:in std_ulogic;
   CKFAST: in std_ulogic; CKEN: in std_ulogic;
   P0: out std_ulogic; P1: out std_ulogic;
   CK5: out std_ulogic; BURSTOK: out std_ulogic
   );
end 201;
architecture RTL of 201 is
   signal PHASEV: std_logic_vector(2 downto 0);
   signal CKEN_INT: std_ulogic;
   signal CKEN_PREC: std_ulogic;
   signal COUNT: std_ulogic;
begin
P0<=PHASEV(0); P1<=PHASEV(1);
CKEN_proc: process(CKFAST)
begin
   if CKFAST' event and CKFAST='0' then
     CKEN_INT<=CKEN; CKEN_PREC<=CKEN_INT;
   end if;
end process;

```
COUNT proc: process(CKFAST)
begin
    if CKFAST' event and CKFAST='0'then
        if RESET='1'then COUNT<='0'; PHASEV<=
            "101";
        elseif(CKEN_INT='1'and CK_PREC='0'and
            COUNT='0') then
              COUNT<='1';PHASEV<="000";
        elseif(PHASE="100" and BURST='1') then
            COUNT<='0';PHASEV<="101";
        elseif COUNT='1'then PHASE<=PHASEV+1;
        end if;
    end process;
CK5<=CKFAST when COUNT='1'else '0';
BURSTOK<=COUNT;
end RTL;
```

Between lines "entity 201" and "end 201", the logic signals (RESET, BURST, CKFAST, CKEN) received by circuit 201 and the signals (P0, P1, CK5, BURSTOK) generated by circuit 201 are defined. These signals are logic signals of conventional type, which can take two logic states noted 0 (low state) and 1 (high state).

Between lines "architecture RTL . . . " and "end RTL", the operation desired for circuit 201 is described. First, logic circuits internal to circuit 201 which are used to generate the signals output by this circuit are defined. A logic vector of dimension 3, noted PHASEV (its components will be noted PHASEV(2), PHASEV(1), and PHASEV(0)), signals CKEN_INT and CKEN_PREC representative of states of control signal CKEN, and a COUNT signal representative of the implementation or the absence of a counting, will be used. Signals PHASEV(1) and PHASEV(0) correspond to output signals P0 and P1, signal PHASEV(2) remaining internal to circuit 201.

A first routine, noted CKEN_proc, defines the states assigned to signals CKEN_INT and CKEN_PREC. When a falling edge appears in clock signal CKFAST, the current state of signal CKEN is assigned to signal CKEN_INT and the old state of signal CKEN$_{13}$ INT is assigned to signal CKEN_PREC. In circuit 201, signal CKEN_INT will control the generation of the output signals. Since the state of signal CKEN is only taken into account on falling edges of signal CKFAST, a synchronism of circuits 18 and 201 is guaranteed, the signals provided to circuit 1, such as signal CKEN, and internal clock signal CKFAST being further, a prior, asynchronous.

A second routine, noted COUNT_proc, defines the states of the signals output by circuit 201. The state switchings of these signals will be performed, as previously, on falling edges of signal CKFAST.

To initialize circuit 201, signal RESET is positioned in the high state. Signal COUNT will then be positioned in the low state and PHASEV=010 (in other words, signals PHASEV (2), PHASEV(1) and PHASEV(0) are positioned, respectively, in the high state, in the low state and in the high state). Signal CK5 is positioned in the low state. To start a test, it is enough for signal CKEN to switch from the low state to the high state. Then, signal COUNT is positioned in the high state. Signal CK5 will then reproduce signal CKFAST. Concurrently, signal BURSTOK switches to the high state.

As concerns vector PHASEV, it will be imposed an initial value 000. Then, P0=0 and P1=0. It is then incremented at each falling edge of signal CKFAST. It will thus take, successively, values 000, 001, 010, 011, 100, 101, 110, 111, 000, 001, etc. The states of signals P0 and P1 will successively be 0 and 0, 0 and 1, 1 and 0, 1 and 1, 0 and 0, etc.

This operation corresponds to the continuous test mode.

If it is desired to implement a burst test, BURST signal is then positioned in the high state. In this case, when vector PHASEV has reached value 100, it is imposed value 101 and signal COUNT is positioned in the low state, which corresponds to an initializing of circuit 201.

FIG. 7a to 7f illustrate the operation of circuit 201.

It is assumed that signal VFCGOFF is in the low state and that signal 18 generates an internal clock signal CKFAST (illustrated in FIG. 7a), of given frequency. Signals RESET, CKEN, BURSTOK, CK5, and P1 are initially in the low state and signals BURST and P0 are initially in the high state. Signals P1 and P thus form logic combination 10.

Assume that signal CKEN (illustrated in FIG. 7b) is positioned in the high state and is subsequently switched back to the low state. The switching of signal CKEN from the high state to the low state causes the switching to the high state of signal BURSTOK. Concurrently, signal CK5 (illustrated in FIG. 7d) starts reproducing the pulses of signal CKFAST and couple (P0, P1) starts taking a predetermined series of states. During the N+1 pulses of filtered clock signal CK5, primary selection signals P1 and P0, illustrated in FIGS. 7e and 7f, will thus successively take the following states: 00, 01, 10, 11, and 00. During the N first periods, the N inputs of multiplexer 8 will then be successively connected to its output. Once the (N+1)-th period has ended, signal BURSTOK switches back to the low state. The signals then recover their initial states.

Figure 7A:
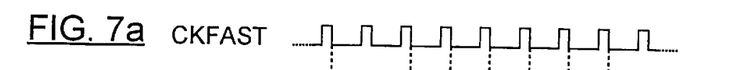
Figure 7B:
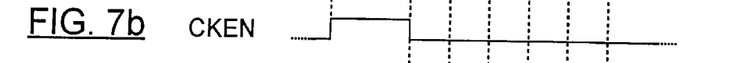
Figure 7C:
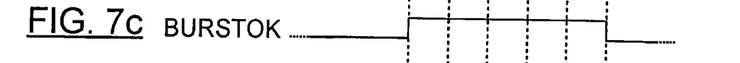
Figure 7D:
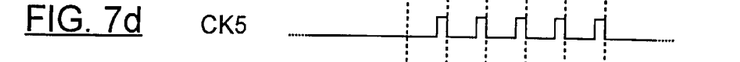
Figure 7E:
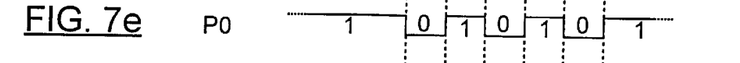
Figure 7F:
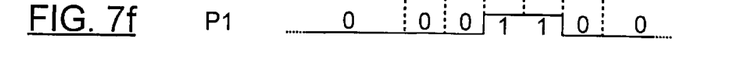

If BURST=0 is chosen, then signal CK5 will reproduce the pulses of signal CKFAST, as long as signal BURST does not switch states. Then, by uninterruptedly providing test vectors, consumption and/or reliability tests can be performed. To test the mean power consumption of circuit 1, with circuit 2 operating permanently, it is enough to measure this power consumption on the supply terminals (not shown) of circuit 1. The power consumption of circuit 1 can be tested according to the operation performed by circuit 2, if said circuit can perform several types of operations. For this purpose, it is enough, once the power consumption has been measured for one type of operation, to modify the issued test vectors and to make a new measurement. To test the reliability of circuit 2, this circuit can, for example, be made to perform a same operation in a loop. Regularly, the resulting vector(s) will be transferred outside of circuit 1, and will be compared to the expected or previously transferred vectors. This can be useful for circuits liable of an aging which can alter their operation, such as memories, for example.

Signal BURSTOK is in the high state as long as signal CK5 reproduces signal CKFAST. It can be used, outside of circuit 1, to check whether the pulse trains, in burst test mode, effectively include the desired number of pulses. It is enough, for this purpose, to measure the duration of the state switching of signal BURSTOK, knowing that the frequency of signal CKFAST can be further determined by measuring the frequency of signal OCK.

5—Skew Circuit

Figure 8:
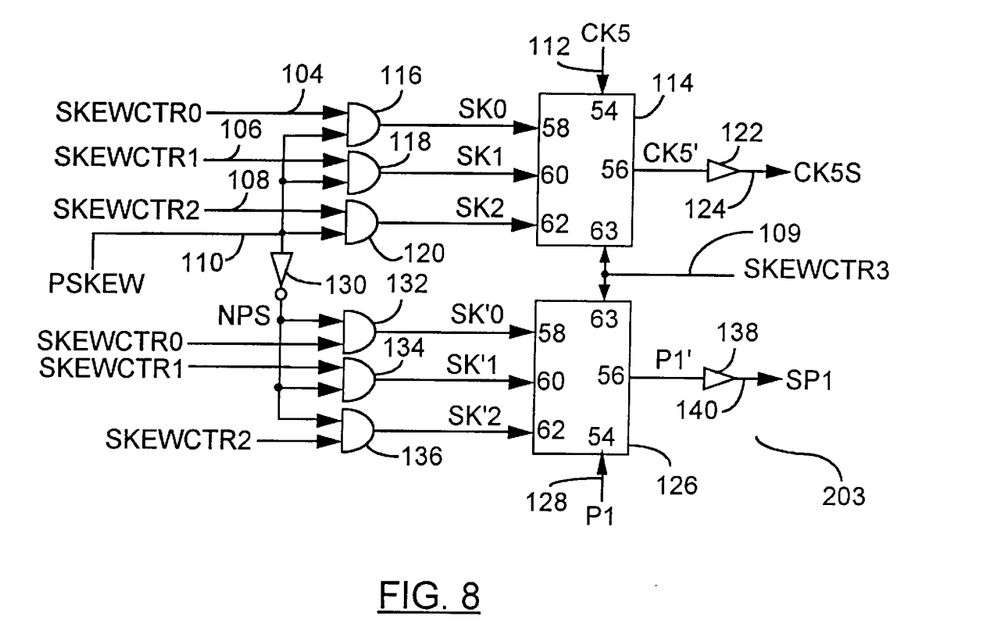
FIG. 8 illustrates a skew circuit introducing a skew between logic signals.

FIG. 8 illustrates an example of implementation of skew circuit 203 illustrated in FIG. 2. It allows introduction of a skew between signals CK5, P0, P1 generated by drive signal generation circuit 201, before they are provided to multiplexer 8 (for P0 and P1), and to circuit 2 and to register 6 (for signal CK5).

It will here be assumed that the provision of signals in the low state on inputs 58, 60, and 62 of a programmable delay circuit identical to programmable delay circuit 50 selects, at the output, the most delayed signal. In other words, referring to FIG. 4, the signal generated on output 56 will correspond to signal Ak of delay circuit 52*b*. If one of the signals on inputs 58, 60, and 62 is in the high state, then the delay introduced between input 54 and output 56 by circuit 50 will be lower.

Circuit 203 receives from circuit 201 signals CK5 and P1 on two inputs 112 and 128. It further receives set SKEWCTR of control signals, formed of four logic signals SKEWCTR0, SKEWCTR1, SKEWCTR2, and SKEWCTR3, received on inputs 104, 106, 108, and 109. It finally receives logic control signal PSKEW on an input 110. Circuit 203 provides logic signals CK5S and SP1 on outputs 124 and 140.

Circuit 203 includes two programmable delay circuits 114 and 126 which will be assumed to be identical to circuit 50 illustrated in FIG. 4.

Circuit 114 receives signal CK5 on its input 54. It provides, on its output 56, a logic signal CK5'. This signal is provided to a buffer circuit 122 which generates signal CK5S based on CK5'.

Circuit 114 receives three logic control signals SK0, SK1, and SK2 on its inputs 58, 60, and 62, and signal SKEWCTR3 on its input 63. Signals SK0, SK1, and SK2 are generated by three two-input AND-type logic gates 116, 118 and 120. Gates 116, 118 and 120 each receive signal PSKEW on an input and, respectively, signals SKEWCTR0, SKEWCTR1, and SKEWCTR2 on their second input.

Circuit 203 includes an inverter 130 which receives signal PSKEW as an input and generates a logic signal NPS, which is the inverse of signal PSKEW.

Circuit 126 receives signal P1 on its input 54. It provides, on its output 56, a logic signal P'1. This signal is provided to a buffer circuit 138 which generates signal SP1 based on P1'.

Circuit 126 receives three logic control signals SK'0, SK'1 and SK'2 on its inputs 58, 60, and 62 and signal SKEWCTR3 on its input 63. Signals SK'0, SK'1, and SK'2 are generated by three two-input AND-type logic gates 132, 134 and 136. Gates 132, 134 and 136 each receive signal NPS on an input and, respectively, signals SKEWCTR0, SKEWCTR1, and SKEWCTR2 on their second input.

Assuming that PSKEW=1 and SKEWCTR0= SKEWCTR1=SKEWCTR2=0, signals SK0, SK1, SK2, SK'0, SK'1, SK'2 are in the low state. Accordingly, signals CK5' and P1' will have an identical delay and no skew will be introduced between signals CK5 and P1. By modifying signals SKEWCTR0, SKEWCTR1, or SKEWCTR2, the delay applied to signal CK5 will be decreased. This amounts, correlatively, to delaying signal P1 with respect to signal CK5. Indeed, signal NPS being maintained in the low state, the delay applied to signal P1 does not vary.

If it is desired to operate in an inverse fashion, by delaying signal CK5 with respect to signal P1, it is then sufficient to position PSKEW in the low state.

Of course, to maintain a coherence in the control of multiplexer 8, skew circuit 202 will be made in a similar fashion as circuit 203.

In a test, signals LCCK and PHASE, generated from signals CK5S, SP0 and SP1, can thus be skewed.

The introduction of a skew, between clock signal LCCK applied to circuit 2 and selection signals PHASE applied to multiplexer 8, allows testing the minimum setup and hold delays of the input or of the logic inputs of the logic circuit to be tested, with respect to the clock signal driving the logic circuit.

Figure 9A:
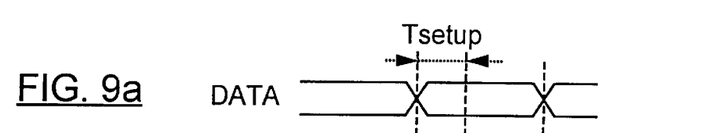
FIGS. 9a and 9b illustrate timing diagrams of data and clock signals.
Figure 9B:
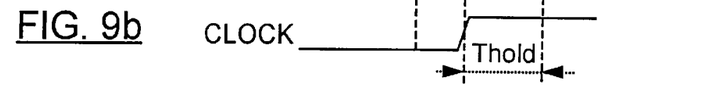

Referring to FIGS. 9*a* and 9*b*, consider a logic circuit driven by a clock signal CLOCK (illustrated in FIG. 9*b*) and receiving a logic signal DATA (illustrated in FIG. 9*a*). The taking into account of the state switchings of signal DATA will be assumed to occur on rising edges of signal CLOCK. The minimum setup delay, noted Tsetup, designates the minimum time delay to be respected between a modification of the state of signal DATA and the rising edge of signal CLOCK to ensure that the modification of the state of signal DATA is taken into account by the logic circuit. Generally, this delay is positive, that is, a state modification of signal DATA can only be taken into account on a subsequent rising edge of signal CLOCK. However, the delay may be negative, if signal DATA is delayed before causing an action. The minimum hold delay, noted Thold, designates the minimum delay to be respected before being able to modify the state of signal DATA, if it is desired that a prior modification be taken into account. This delay is generally close to zero.

Of course, the present invention is likely to have various alterations, modifications, and improvements which will readily occur to those skilled in the art.

Thus, different devices may be implemented to generate the described signals. The polarities of the different generated signals may also be modified and the described circuits may be adapted accordingly. Also, for example, the possibilities offered by the test circuit may be limited by generating a signal CKFAST of fixed frequency and/or duty ratio and/or polarity, or else by introducing no skew between the clock and selection signals.

Several test registers operating in parallel at the input and/or at the output of the circuits to be tested may of course be available, according to the dimensions of the test vectors and of the resulting vectors, which themselves depend on the type of tested circuit. In this case, said registers can be connected in series, to enable a loading and/or unloading of these registers from a single primary input/output. If the dimension of the test vectors is higher than or equal to 2, a multiplexer may be associated with each of the registers which store the patterns formed by the set of one of the states of the vectors.

Several test registers may also be available to test several different internal circuits. These registers can be connected in series, to enable a loading of the test registers and/or an unloading of these registers from a single primary input/output.

Similarly, the test registers and/or part of the flip-flops forming these registers may be used for other purposes, in normal operation, by providing adequate multiplexing means on inputs and/or outputs of these registers or of these flip-flops. This allows use of these registers or flip-flops outside the test mode, which is advantageous in terms of useful surface occupied for the normal operation.

The primary inputs/outputs which are used in the context of functional tests may be used for other purposes in normal operation, by adding appropriate multiplexing and demultiplexing means. This double functionality is well known in the field of integrated circuits, and has the advantage of limiting the number of primary inputs/outputs of the circuits dedicated to the testing.

Similarly, different transfer directions may be defined according to whether the current mode is the test mode or the normal operation mode. The primary inputs and outputs of circuit 1, in test mode, may have a different functionality in normal operation mode. Thus, for example, input 12 may very well be used as an input in test mode and as an output in normal operation mode, or conversely.

A multiplexer may also be used to selectively connect input D of flip-flop B'1 to output OUT of circuit 2 or to output Q of flip-flop BN. Thereby, a single register of N+M flip-flops accessible, at the input, on input 12, and at the output, on output 16, may be created. Test registers 4 and 6 may thus be tested, by issuing N+M logic states to input 12 and by performing a shifting of 2*(N+M) cycles in these registers, to transfer these states on output 16. If the flip-flops operate properly, then the states transferred on output 16 correspond to the states issued on input 12. These register may, possibly, be tested independently, by using means for connecting the output of flip-flop BN and input D of flip-flop B'1 to different primary inputs/outputs of circuit 1, which enables to minimize the duration of the test.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of functional testing an integrated circuit including at least one internal logic circuit to be tested, the at least one internal logic circuit including at least one input and at least one output, the method comprising steps of:

providing at least one test pattern, formed of a set of logic states, on a first input of the integrated circuit and storing the at least one test pattern in a first test register, the step of providing the at least one test pattern being synchronized by an external clock signal received on a second input of the integrated circuit;

serially providing the at least one test pattern to the at least one input of the at least one internal logic circuit, the step of serially providing being synchronized by a test clock signal generated by time filtering an internal clock signal generated in the integrated circuit, so that the operation of the at least one internal logic circuit is limited in time to a duration necessary for the at least one internal logic circuit to receive the at least one test pattern and to generate the at least one resulting pattern, the internal clock signal having a frequency higher than the frequency of the external clock signal;

storing, in a second test register connected to the at least one output of the at least one internal logic circuit, at least one resulting pattern generated by the at least one internal logic circuit when the at least one test pattern is provided thereto, the step of storing being synchronized by the test clock signal; and providing, on a first output of the integrated circuit, the at least one resulting pattern, the step of providing the at least one resulting pattern being synchronized by the external clock signal.

2. The method of claim 1, wherein the internal clock is generated by a programmable ring oscillator.

3. A method of functional testing an integrated circuit including at least one internal logic circuit to be tested, the at least one internal logic circuit including at least one input and at least one output, the method comprising steps of:

providing at least one test pattern, formed of a set of logic states, on a first input of the integrated circuit and storing the at least one test pattern in a first test register, the step of providing the at least one test pattern being synchronized by an external clock signal received on a second input of the integrated circuit;

serially providing the at least one test pattern to the at least one input of the at least one internal logic circuit by a parallel-to-series conversion circuit, so that the at least one test pattern can be provided several times to the at least one internal logic circuit, once the at least one test pattern has been stored in the first test register, the parallel-to-series conversion circuit being driven by control signals, generation of which is synchronized with a test clock signal generated from an internal clock signal generated in the integrated circuit, the internal clock signal having a frequency higher than the frequency of the external clock signal, the control and test clock signals being provided to the parallel-to-series conversion circuit and to the at least one internal logic circuit by programmable skew circuits, so that a time skew can be introduced between the control signals and the test clock signal;

storing, in a second test register connected to the at least one output of the at least one internal logic circuit, at least one resulting pattern generated by the at least one internal logic circuit when the at least one test pattern is provided thereto, the step of storing being synchronized by the test clock signal; and providing, on a first output of the integrated circuit, the at least one resulting pattern, the step of providing the at least one resulting pattern being synchronized by the external clock signal.

4. The method of claim 3, wherein the internal clock signal is generated by a programmable ring oscillator.

5. An integrated circuit including an internal logic circuit and testing means for testing operation of the internal logic circuit, the internal logic circuit including an input and an output, wherein the testing means comprises:

a first test register having an input connected to a first input of the integrated circuit and at least one output connected to the input of the internal logic circuit;

a second test register having an input connected to the output of the internal logic circuit and an output connected to a first output of the integrated circuit;

a clock input connected to a second input of the integrated circuit for receiving an external clock signal to drive a provision to the first test register of at least one test pattern received on the first input, the at least one test pattern being formed of a set of logic states, and to drive a provision to the first output of at least one resulting pattern stored in the second test register, the at least one resulting pattern being generated on the output of the internal logic circuit when the at least one test pattern is provided to the input of the internal logic circuit;

a clock signal generation circuit for generating an internal clock signal, the clock signal generation circuit including a first programmable delay circuit for generating a programmable delay and logic circuits that implement a ring oscillator programmable by looping back of an input and of an output of the first delay circuit, the first delay circuit of the clock signal generation circuit generating a square signal of programmable frequency, wherein the clock signal generation circuit includes a second programmable delay circuit receiving the square signal and providing a delayed square signal, a logic gate generating an intermediary clock signal from a combination of the square signal and of the delayed square signal, so that the intermediary clock signal has a programmable duty ratio, and means for generating the internal clock signal from the intermediary clock signal; and a control circuit for providing, from the internal clock signal, a test clock signal that drives the provision of the at least one test pattern to the input of the internal logic circuit and the provision of the at least one resulting pattern to the input of the second test register.

6. The circuit of claim 5, wherein the integrated circuit includes a second output, and wherein the testing means further comprises a frequency dividing circuit for receiving the internal clock signal and generating a derived internal clock signal having a lower frequency than the internal clock signal, the lower frequency being representative of a frequency of the clock signal, and the derived internal clock signal being provided to the second output of the integrated circuit.

7. An integrated circuit including an internal logic circuit and testing means for testing operation of the internal logic circuit, the internal logic circuit including an input and an output, wherein the testing means comprises:

a first test register having an input connected to a first input of the integrated circuit and at least one output connected to the input of the internal logic circuit;

a second test register having an input connected to the output of the internal logic circuit and an output connected to a first output of the integrated circuit;

a clock input connected to a second input of the integrated circuit for receiving an external clock signal to drive a provision to the first test register of at least one test pattern received on the first input, the at least one test pattern being formed of a set of logic states, and to drive a provision to the first output of at least one resulting pattern stored in the second test register, the at least one resulting pattern being generated on the output of the internal logic circuit when the at least one test pattern is provided to the input of the internal logic circuit;

a clock signal generation circuit for generating an internal clock signal; and a control circuit for providing, from the internal clock signal, a test clock signal that drives the provision of the at least one test pattern to the input of the internal logic circuit and the provision of the at least one resulting pattern to the input of the second test register;

a parallel to series conversion circuit placed between the first test register and the input of the internal logic circuit, wherein the control circuit includes a circuit of generation of drive signals for generating a filtered clock signal and primary selection signals and skew circuits receiving the filtered clock signal and the primary selection signals, the skew circuits including programmable delay circuits for generating, from the received filtered clock signal and the primary selection signals, the selection signals driving the parallel-to-series conversion circuit and the test clock signal, the selection signals driving the parallel-to-series conversion circuit being skewed with respect to the test clock signal, the selection signals being generated based on the internal clock signal.

8. The circuit of claim 7, wherein the integrated circuit includes a second output, and wherein the testing means further comprises a frequency dividing circuit for receiving the internal clock signal and generating a derived internal clock signal having a lower frequency than the internal clock signal, the lower frequency being representative of a frequency of the internal clock signal, and the derived internal clock signal being provided to the second output of the integrated circuit.

9. An integrated circuit including an internal logic circuit and testing means for testing operation of the internal logic circuit, the internal logic circuit including an input and an output, wherein the testing means comprises:

a first test register having an input connected to a first input of the integrated circuit and at least one output connected to the input of the internal logic circuit;

a second test register having an input connected to the output of the internal logic circuit and an output connected to a first output of the integrated circuit;

a clock input connected to a second input of the integrated circuit for receiving an external clock signal to drive a provision to the first test register of at least one test pattern received on the first input, the at least one test pattern being formed of a set of logic states, and to drive a provision to the first output of at least one resulting pattern stored in the second test register, the at least one resulting pattern being generated on the output of the internal logic circuit when the at least one test pattern is provided to the input of the internal logic circuit;

a clock signal generation circuit for generating an internal clock signal; and a control circuit for providing, from the internal clock signal, a test clock signal that drives the provision of the at least one test pattern to the input of the internal logic circuit and the provision of the at least one resulting pattern to the input of the second test register, wherein the control circuit includes filtering means for generating, based on the internal clock signal, in a burst test mode, the test clock signal driving the operation of the internal logic circuit, the test clock signal including at least one pulse train including a determined number of pulses.

10. The circuit of claim 9, wherein the control circuit provides a logic signal representative of a duration of pulse trains in the burst test mode.

\* \* \* \* \*